United States Patent [19]

Mycynek

[11] Patent Number: 4,940,978

[45] Date of Patent: Jul. 10, 1990

[54] STEPWISE ADJUSTED DIGITAL TO ANALOG CONVERTER HAVING SELF CORRECTION

[75] Inventor: Victor G. Mycynek, Des Plaines, Ill.

[73] Assignee: Zenith Electronics Corporation, Glenview, Ill.

[21] Appl. No.: 197,737

[22] Filed: May 23, 1988

[51] Int. Cl.$^5$ ............................................. H03K 13/02
[52] U.S. Cl. ..................................... 341/150; 341/144
[58] Field of Search ............... 341/150, 165, 127, 145, 341/154, 118, 150, 144

[56] References Cited

U.S. PATENT DOCUMENTS

| | | | |
|---|---|---|---|
| 4,491,825 | 1/1985 | Tuthill | 341/145 |
| 4,611,195 | 9/1986 | Shosaku | 341/150 |
| 4,618,847 | 10/1986 | Iida et al. | 341/154 |
| 4,638,303 | 1/1987 | Masuda et al | 341/154 |
| 4,665,380 | 5/1987 | Lewyn | 341/150 |

Primary Examiner—William M. Shoop, Jr.
Assistant Examiner—Helen Kim

[57] ABSTRACT

A highly accurate, inexpensive digital to analog converter requiring minimal accuracy in component values. A digital word is received serially, the least significant bit first. A voltage is stored on a capacitor at each bit, the value of the voltage being halfway between a reference voltage and the previously stored voltage, the reference voltage value depending on whether the bit is a logic "1" or "0". In each case, the halfway point of the voltage difference is determined by coupling to the midpoint of a pair of resistive components having essentially the same value. The value of the stored voltage represents the analog value of the digital word. The process is preferably repeated for the same word and the two resulting final voltages is averaged to eliminate any effect of a slight difference in component values in a pair.

11 Claims, 3 Drawing Sheets

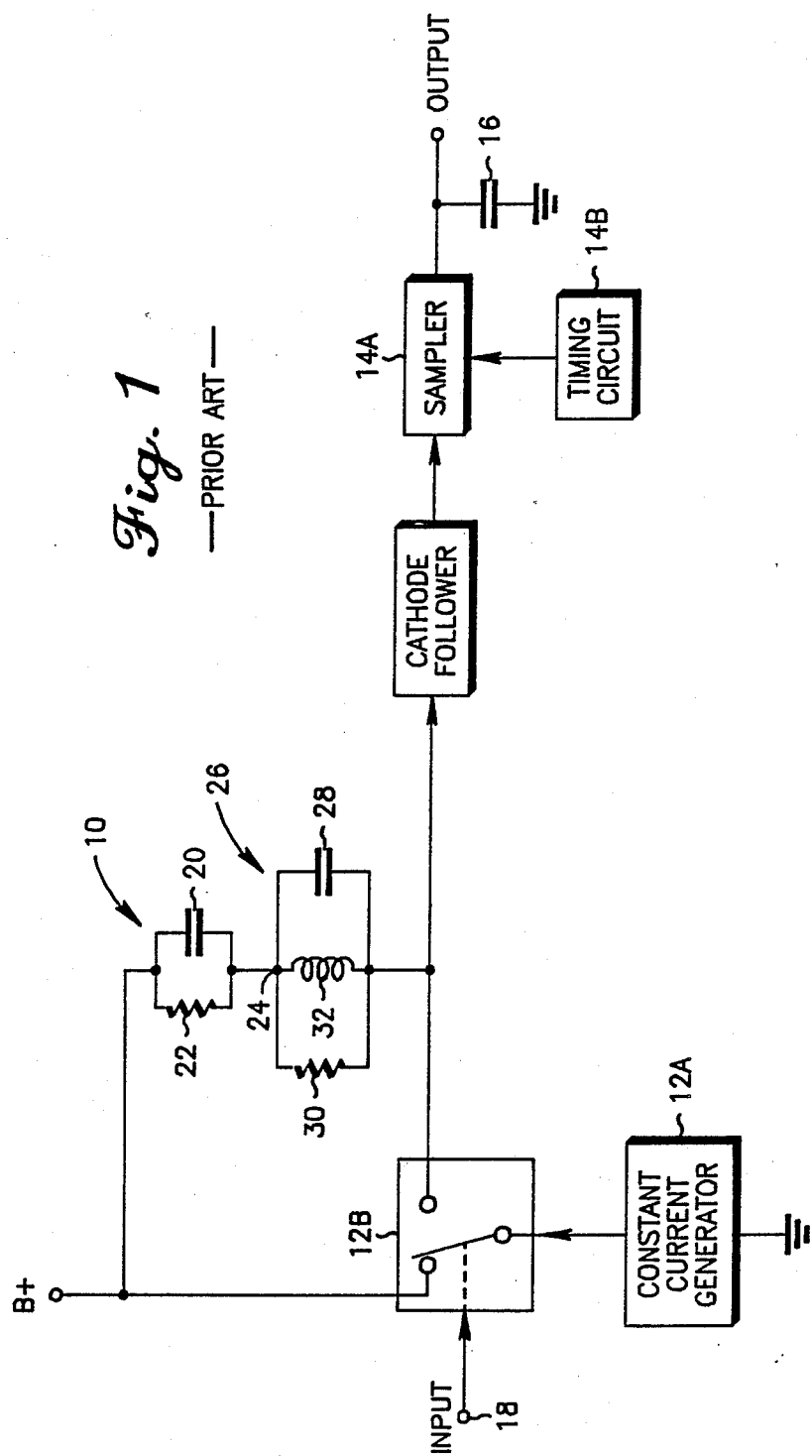
Fig. 1 —PRIOR ART—

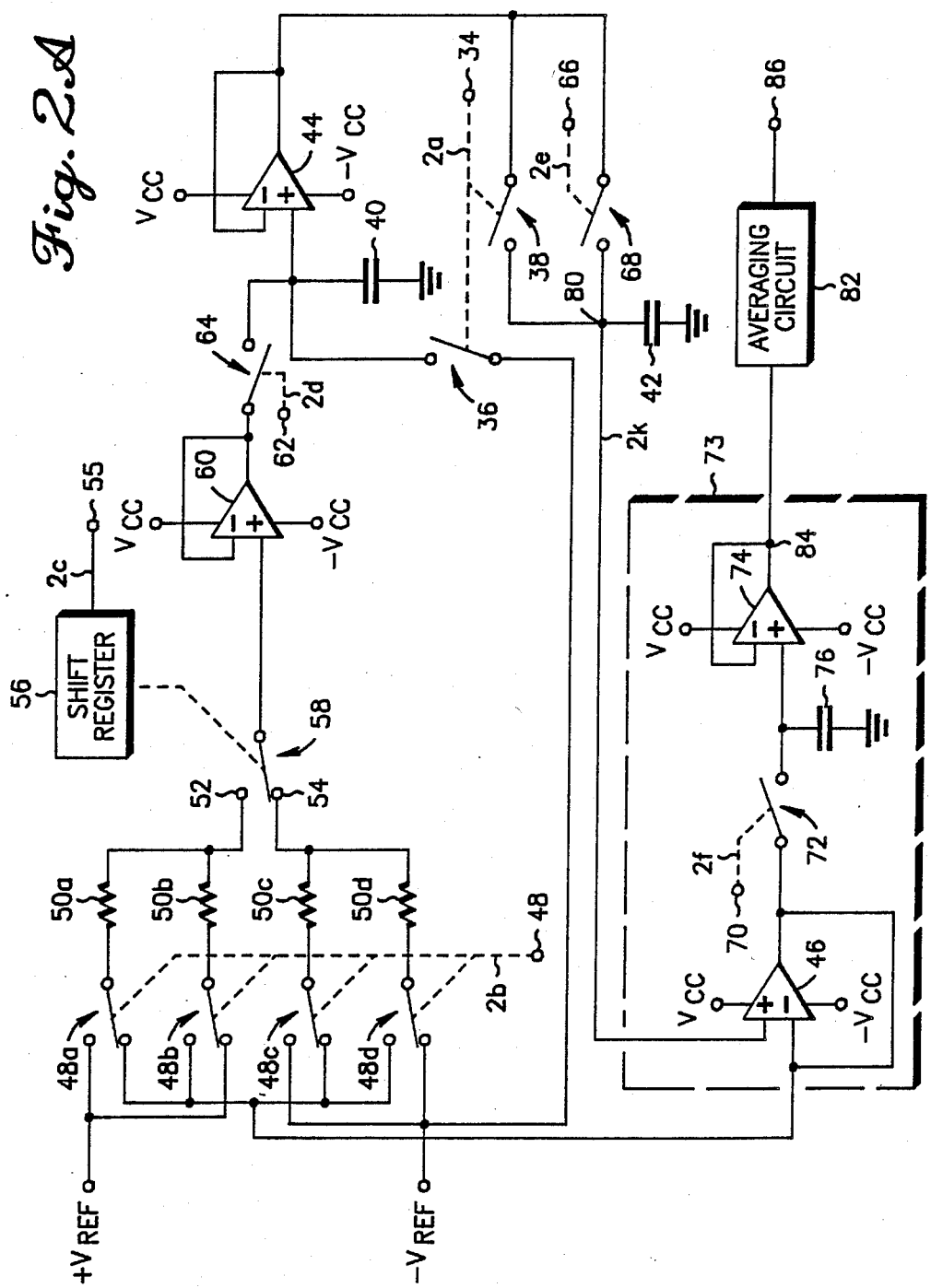

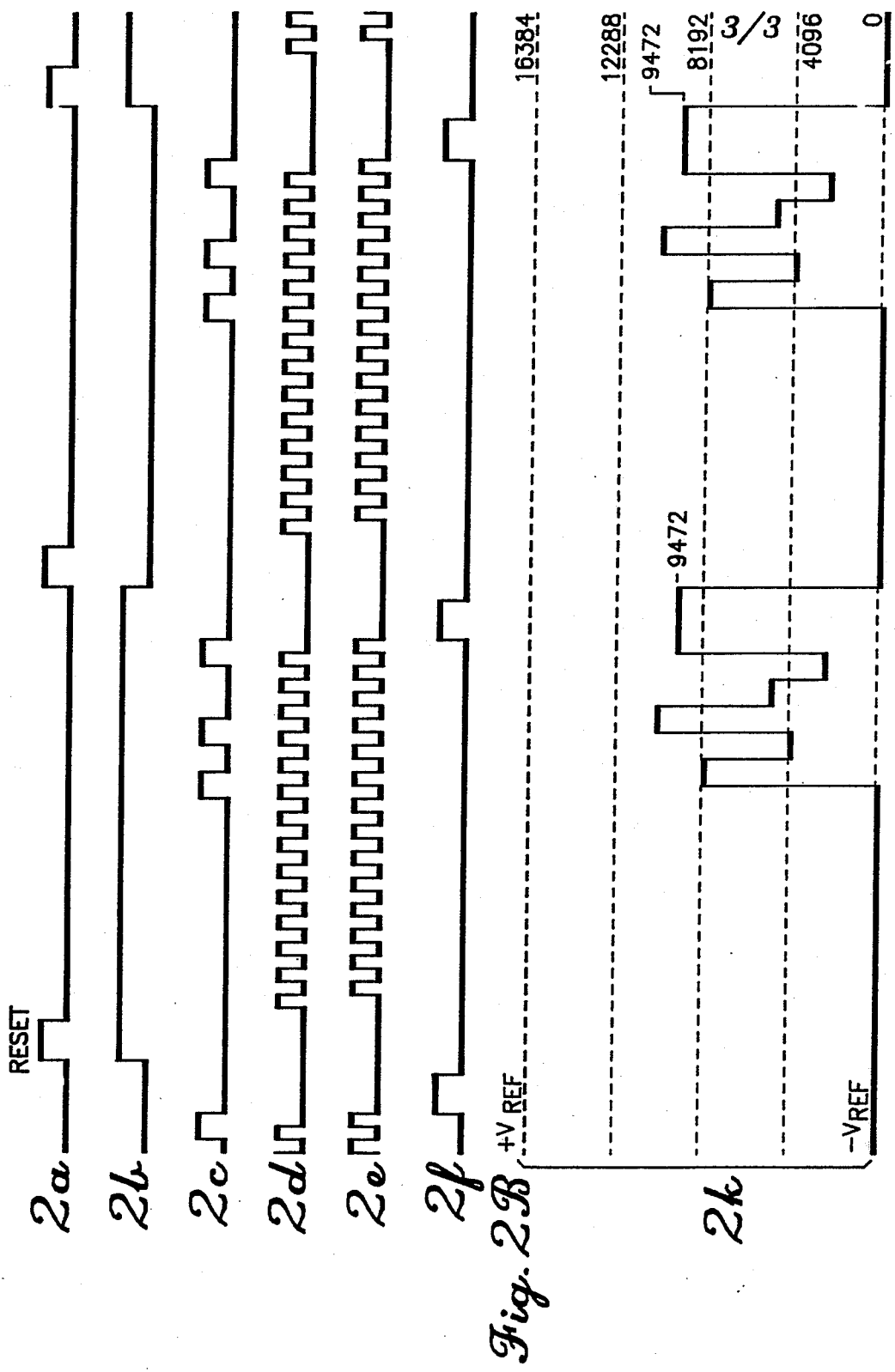

STEPWISE ADJUSTED DIGITAL TO ANALOG CONVERTER HAVING SELF CORRECTION

BACKGROUND OF THE INVENTION

This invention relates to the field of digital to analog converters and, more particularly, to highly accurate, yet simple and inexpensive converters.

In a typical digital/analog transmission system, an analog signal is sampled at a minimum rate of two times the highest frequency in the signal. The samples are quantized and encoded as a pulse code modulated (PCM) signal. The "words" representing the PCM signal are typically 14–16 bits long. The encoded digital signal is then transmitted serially, least significant bit (LSB) first, in the desired fashion. After reception, the analog signal must be retrieved by complementary decoding and a digital to analog (D/A) conversion. The conversion must be done simply, quickly and accurately. Thus, the function of a digital to analog converter is to decode a series of digital bits back into the original analog signal from which the digital bits were derived. Early digital to analog converters utilized a resistive divider or ladder as the heart of the converter. Such networks are shown in many texts such as "Digital Principles and Applications" by Malvino and Leach (McGraw-Hill, Inc. 1969).

One well-known D/A converter which is theoretically satisfactory was designed by Claude Shannon some years ago. In that converter, at each digital bit a capacitor is caused to charge, then discharge exponentially according to an RC time constant, with the value of the charge at the end of a digital "word" representing the original analog value of that word. In practice, however, the basic Shannon converter requires such a high degree of precision in the resistive and capacitive components that it is not practical for use in a consumer product. The Shannon converter and an improvement by A. J. Rack will be described in more detail hereinbelow.

At the present time, there are many integrated circuit D/A converters available on the market but most are relatively expensive to manufacture due to the need for large numbers of internal components and the precision matching of the components.

SUMMARY OF THE INVENTION

It is, therefore, an object of the present invention to provide a D/A converter which provides accurate, fast conversion for single or multiple signals.

It is another object to provide a high quality D/A converter which is simple and inexpensive to construct, with easy reproducibility.

These objects and others which will become apparent are obtained by a D/A converter in which, at each bit, the voltage on a capacitor is set to a voltage which is related to the analog signal value represented by that bit and the preceding bits. Over the series of bits representing a digital word, the capacitor voltage assumes a value related to the analog value of that word. Then the process is repeated with the positions of a set of divider resistors reversed so that any slight residual error due to resistor tolerances is cancelled out. The circuit is easily adaptable to implementation in an integrated circuit due to the minimal precision required in the resistors.

BRIEF DESCRIPTION OF THE DRAWING

FIG. 1 is a schematic diagram of a D/A converter of the prior art.

FIG. 2A is a schematic diagram of a D/A converter according to the present invention.

FIG. 2B is a chart of waveforms 2a to 2f, and 2k related to the converter of FIG. 2A.

DETAILED DESCRIPTION OF A PREFERRED EMBODIMENT

The prior art digital-to-analog (D/A) converter shown in FIG. 1 was designed by Claude E. Shannon of the Bell Laboratories, and includes a later improvement by A. J. Rack. Many articles have been published on this Shannon D/A converter; a particularly good description of the Shannon converter and the subsequent improvement by Rack appears in the Bell Laboratories' "RECORD" of November, 1948, in an article by R. L. Carbrey, entitled "Decoding in PCM", pp. 451–456. Another good description will be found in "Digital and Sampled-Data Control Systems" by Julius T. Tou, McGraw-Hill, 1959.

The Shannon decoder is a very simple but effective decoder, comprising basically a resistance-capacitor circuit 10, a constant current source 12A for supplying the RC circuit with precisely controlled units of charge at precisely determined times in response to the input pulses, and a sample-and-hold circuit 14A, under the control of an accurate timing circuit 14B, for sampling and storing on a holding capacitor 16 the potentials across the RC circuit 10. Typically not shown in diagrams of the Shannon-Rack converter are the limiting and shaping circuits which transform received pulses into suitable form for use in the D/A converter circuit. In order to supply identical amounts of charge at each pulse, the current source 12A is switched by a gating circuit 12B which is controlled by the frequency of the incoming pulses at an input terminal 18.

The incoming binary PCM signal is arranged with the LSB applied to the D/A converter first and the most significant bit (MSB) last. During each "1" of the incoming signal, a current is coupled from the current source 12A to the RC circuit 10 which includes a capacitor 20 and a resistor 22. The current source 12A is uncoupled from the RC circuit 10 when a zero is received. The time constant (t=RC) of the circuit 10 is carefully chosen so that any charge on the capacitor 20 decays exactly one-half during each pulse interval. The first-received pulse (the LSB) will therefore decay the most, while the later-received pulses will decay proportionately less. Thus, the contribution of each bit to the final charge on the capacitor is properly weighted to reflect the position of that bit in the pulse group. In other words, since the binary digits are received serially, with the LSB received first, the charge on the capacitor 20 (or the voltage across the capacitor) at the end of a complete code group of pulses represents the analog equivalent of the digital pulses of the received PCM signal.

It will be apparent that in such a decoder, the accuracy of the time constant is important and the timing of the sample-and-hold circuit is critical since the final value is present for only a brief instant, one pulse period later than the most significant bit (MSB) is received. While such accuracy is obtainable, it does require high precision components with attendant expense. The requirement for such accurate timing was subsequently reduced in a modification of the Shannon circuit by A. J. Rack.

Rack's decoder was quite similar to that of Shannon, but Rack added, at the point referenced 24 in FIG. 1, a damped resonant circuit 26 in series with the RC network 10. The circuit 26 includes a capacitor 28, a resistor 30 and an inductance 32. The capacitance and inductance values of the circuit 26 are chosen to provide a resonance at the code-pulse frequency, and the resistor 30 is chosen so that the amplitude of the oscillations developed across the circuit 26 is reduced to one-half at each cycle. When the circuits 10 and 26 are coupled together, the sum of the output voltages is a discharge curve which is roughly exponential but has flat portions at one-code-period intervals. Therefore, the timing of the sample-and-hold circuit 14A does not have to be nearly so precise as in Shannon's design since sampling is done during the brief but relatively constant-value portions at the end of each pulse group. This Rack modification, however, still yields a relatively expensive design for a consumer product.

FIG. 2A is a logic diagram of an embodiment of the present invention and FIG. 2B shows the corresponding signals at significant points in the circuit. The circuit as seen in FIG. 2A is similar in some respects to that of FIG. 1 but, instead of requiring a very precise time constant and current source for charging the capacitor 20 by a predetermined amount at each received "1", and letting the charge on the capacitor decay exponentially to one-half that value during each pulse period, a capacitor is simply set to the desired value at each pulse.

As may be seen in FIG. 2B, during the RESET period an initializing signal 2a is applied via an input terminal 34 closing two switches 36, 38. This action resets or initializes two capacitors 40, 42 and the input and output of two voltage followers 44, 46 to the reference voltage $-V_{ref}$. At initialization, an enabling or mode signal 2b at an input terminal 48 is applied to control four SPDT switches 48a,48b,48c,48d which reverse the positions of four resistors 50a,50b,50c,50d comprising two networks, as will be explained. The four switches 48 are preferably CMOS switches.

Since the four resistors have essentially the same values, when the decoding process begins for a digital word, the voltage at the midpoint 52 of the resistors 50a, 50b, starts out at a value which is $0.5 [(+V_{ref})+(-V_{ref})]$. It should be noted that the value of $|+V_{ref}|$ is not necessarily equal to $|-V_{ref}|$ and, in the example of FIG. 2B, $-V_{ref}$ is 0 and $+V_{ref}$ is 16384. Since the output voltage of the voltage follower 46 is $-V_{ref}$ at this point, and that voltage is coupled to both resistors 50c and 50d, the midpoint 54 of those resistors is also $-V_{ref}$. A serially arranged PCM data signal 2c is applied via an input terminal 55 and is stored in a shift register 56 for controlling a SPDT switch 58. The functioning of the shift register 56 will be further explained hereinbelow.

If the first bit of the digital word is a "0", the switch 58 couples the point 54 to the input of a voltage follower 60. The signal 2d, a clock signal, is applied via an input terminal 62 to close a SPST switch 64 for transferring the voltage on the output of the voltage follower 60 to the capacitor 40 and to the voltage follower 44 once per pulse period.

Another clock signal 2e, having the same frequency as signal 2d but different phase, is coupled to an input terminal 66 for controlling a SPST switch 68 which couples the output of the voltage follower 44 to the capacitor 42 and back to an input of the voltage follower 46. The frequency of both of the signals 2d and 2e are preferably derived from the code pulse frequency of the received digital signal A signal 2f is coupled to an input terminal 70 for controlling a SPST switch 72 in a sample-and-hold circuit (in dashed line 73) which comprises a voltage follower 74 and a capacitor 76 as well as the voltage follower 46. The signal 2k represents the voltage at a point 80, the voltage which is to be sampled at the end of the word.

To review the complete operation of the converter, the signal 2a has reset the capacitors 40, 42 by temporarily closing the switches 36, 38. In the example shown in signal 2c of FIG. 2B, the 14-bit digital word is 10010100000000 (decimal equivalent=9472). Remembering that the 14-bit digital word is fed serially to the D/A converter, LSB first, the first eight bits to be decoded are zeroes and the voltages at the points 52, 54, 80 are all zero (zero representing the value of $-V_{ref}$) during that period. The ninth bit received is a "1", causing the switch 58 to move from coupling to point 54 to coupling to point 52, thus putting $0.5[(+V_{ref})+(-V_{ref})]$ (representing 16384/2 or 8192 in this example) on the voltage follower 60 and, when clocked by signal 2d, on the capacitor 40. This voltage is subsequently clocked by signal 2e onto the capacitor 42 and back to the voltage follower 46. It should be noted here that the maximum value (16383) is the decimal value of a 14-bit binary word consisting of all "1's".

The tenth received bit is a "0", thus the switch 58 reverses position, and the voltage coupled first to the capacitor 40 and then to the capacitor 42 represents the value 8192/2 or 4096. Since the eleventh bit is a "1", switch 58 reverses and the new voltage coupled through the circuit represents 4096+(16384−4096)/2 =10240. The next two bits are "0's" so the switch 58 again reverses and stays reversed for two pulse periods. The result is an output representing 10240/2 =5120, then 5120/2 =2560. The fourteenth and most significant bit (MSB) is again a "1. The final voltage represents 2560+(16384−2560)/2 =9472.

This final voltage, although theoretically correct, may include a small error due to the pairs of resistors 50 not having exactly the same values. This small error is essentially eliminated by simply repeating the previously described process, i.e., converting the digital word again, with the positions of the resistors reversed, then averaging the two values obtained. The two conversions, naturally, must be done within the time period of one digital word, thus the need for the storage register 56. For the second conversion, the mode signal 2b reverses the four switches 48a–d which, in turn, reverses the positions of the ends of each of the two divider networks comprised of resistors 50a,b and 50c, d, respectively. Each of the final values of essentially 9472 is sampled by the sample-and-hold circuit 73 when the switch 72 is closed by the signal 2f. An averaging circuit 82 is coupled to a sample-and-hold output 84, thus the averaged output signal at a terminal 86 provides a very accurate analog value corresponding to the received 14-bit digital word. Further processing of the analog values is done by circuits (not shown) which form no part of the present invention. It will also be apparent to those skilled in the art that the present digital to analog converter could easily be made to function as a multiplying converter by simply adding the multiplying signal and the inverted form thereof to the voltages $+V_{ref}$ and $-V_{ref}$.

Although not required in the preferred embodiment, the operation of the circuit can be expanded for use with multiple signals. The multiplexing can be done easily by inserting the additional signals between the signals representing the two conversions of one word, as illustrated in FIG. 2B, and those of the subsequent word. In this mode, a separate sample-and-hold circuit would be required for each signal, with proper phasing to sample only the respective values.

Thus there has been shown and described a digital-to-analog converter using a minimum of relatively low tolerance components and readily adapted to realization in integrated circuit form. Digital words are received in serial form, LSB first. At the bit rate, and depending on whether a given bit is a "1" or a "0", a capacitor is charged to a value which is half the distance to the corresponding reference voltage. The final value, representing the value of the word, is then sampled and, preferably, the process is repeated with certain critical components reversed in position to eliminate any error due to slight differences in resistance value. The two values of the word are then averaged and applied to subsequent signal processing circuitry.

It will be apparent to those skilled in such circuitry that other variations and modifications are possible in the present invention, and it is intended to cover all such as fall within the scope of the present invention.

What is claimed is:

1. A digital to analog converter comprising:
    means for receiving an input signal made up of digital words in serial form, the least significant bit of each word being received first;
    switching means controlled by said input signal;
    first supply means for supplying a first reference voltage;
    a terminal point;
    a first resistor network having a first end coupled to said first supply means, the second end coupled to said terminal point and having the midpoint thereof coupled to a first input of said switching means, the halves of said first network consisting of essentially equal-valued resistance;
    second supply means for supplying a second reference voltage;
    a second resistor network having a first end coupled to said second supply means, the second end coupled to said terminal point and having the midpoint thereof coupled to a second input of said switching means, the halves of said second network consisting of essentially equal-valued resistances; and
    storage means coupled to said terminal point and coupled to the output of said switching means for receiving, in response to each received bit, a voltage which is one-half the difference between the respective reference voltage and the voltage on said terminal point.

2. The digital to analog converter according to claim 1 and further including a sample-and-hold circuit and second switching means for enabling sampling at the end of each word, and wherein the sampled voltage represents the value of said word.

3. The digital to analog converter according to claim 1 and wherein said storage means includes at least first and second capacitors, second and third and fourth switching means controlled for allowing said stored voltage to be moved from said first capacitor to said second capacitor and to a second terminal point.

4. The digital to analog converter according to claim 1 and further including second switching means for reversing the positions of the ends of the first and second resistor networks, respectively, at the end of each received word, each word being converted twice.

5. The digital to analog converter according to claim 2 and further including an averaging circuit coupled to the output of said sample-and-hold circuit for averaging the sampled voltages.

6. A digital to analog converter for receiving digital words and providing an output voltage corresponding to the analog value of each word;
    storage means for storing a voltage at each received bit;
    first and second reference voltages;
    means for providing at each received bit a new voltage which is one half the difference between one of said reference voltages and the currently stored voltage, said new voltage becoming the currently stored voltage for the subsequently received bit; and
    means responsive to said received bits for determining which of said first and second reference voltages is utilized at each bit.

7. The digital to analog converter according to claim 6 and further including sample and hold means for sampling and holding the stored voltage when a complete word has been received.

8. The digital to analog converter according to claim 7 and further including at the input of the converter second storage means for storing each received word and presenting each word twice in succession for conversion, and averaging means coupled to said sample and hold means output for providing an average of the two conversions.

9. The digital to analog converter according to claim 6 and wherein the voltage providing means includes divider means coupled to each of said reference voltages for dividing said difference voltage, and the converter further includes means for reversing the positions of the ends of each said divider means for cancelling out any difference in component values.

10. The digital to analog converter according to claim 9 and wherein each said divider means comprises a pair of serially-connected resistive components, the values of the components in a pair having essentially the same value.

11. The digital to analog converter according to claim 10 wherein said responsive means includes switching circuitry for coupling said storage means to the midpoint of one of said pairs of resistive components when a bit of a received word is a logic "1", and to the midpoint of the other of said pairs of resistive components when a bit of a received word is a logic "0".

* * * * *